United States Patent [19]
Hileman

[11] Patent Number: 5,999,404
[45] Date of Patent: Dec. 7, 1999

[54] SPRAY COOLED MODULE WITH REMOVABLE SPRAY COOLED SUB-MODULE

[75] Inventor: Vince P. Hileman, San Jose, Calif.

[73] Assignee: Sun Microsystems, Inc., Mountain View, Calif.

[21] Appl. No.: 09/172,443

[22] Filed: Oct. 14, 1998

[51] Int. Cl.⁶ ........................................... H05K 7/20
[52] U.S. Cl. ................. 361/699; 361/689; 361/696; 361/698; 361/701; 361/704; 174/15.1; 165/80.4; 165/104.33
[58] Field of Search .................... 361/689–691, 361/698, 699, 700–704, 719; 174/15.1, 15.2; 165/80.4, 104.33, 185

[56] References Cited

U.S. PATENT DOCUMENTS

| | | | |
|---|---|---|---|
| 5,131,859 | 7/1992 | Bowen et al. ........................... | 165/80.4 |
| 5,424,916 | 6/1995 | Martin ...................................... | 361/698 |
| 5,646,824 | 7/1997 | Ohashi et al. ........................... | 361/699 |
| 5,870,284 | 2/1999 | Stewart et al. .......................... | 361/699 |
| 5,870,823 | 2/1999 | Bezama et al. ......................... | 165/80.4 |

Primary Examiner—Leo P. Picard
Assistant Examiner—Boris L. Chervinsky
Attorney, Agent, or Firm—Blakey Sokoloff Taylor & Zafman

[57] ABSTRACT

An electronic system that may include an electronic card sub-module that is electrically connected to, and in fluid communication with, an electronic card module. The electronic card module can be mated with a motherboard and coupled to a manifold of a cooling system that provides a cooling fluid to the modules. The cooling fluid can flow directly onto integrated circuits or integrated circuit packages located within the modules. Each module may have an electrical connector and a fluid connector that allows the sub-module to be plugged into the module, and the module to be plugged into the motherboard and manifold without using any tools or hardware.

17 Claims, 2 Drawing Sheets

SPRAY COOLED MODULE WITH REMOVABLE SPRAY COOLED SUB-MODULE

BACKGROUND OF THE INVENTION

1. Field of the Invention

The present invention relates to an electronic assembly which has an electronic card module and an electronic card sub-module that are coupled to a cooling system that provides a cooling fluid to the modules.

2. Background Information

Integrated circuits are typically assembled into packages that are soldered to a printed circuit board. The printed circuit board may be the substrate of an electronic card that is plugged into a mating connector of a motherboard.

During operation the integrated circuit generates heat. The heat must be removed to insure that the junction temperatures of the circuit do not exceed an undesirable value. Some electronic cards incorporate heat slugs and heat sinks to facilitate the removal of heat from the circuit. The heat may flow into the ambient air from the heat slug/sink by forced or natural convection.

Integrated circuits such as microprocessors may generate heat that cannot be effectively removed with conventional heat sink/convection cooling systems. There have been developed electronic systems which incorporate heat pipes that transfer heat away from the integrated circuit. Heat pipes also have thermal limitations and are more expensive than conventional heat sinks.

There has also been developed electronic systems which incorporate a nozzle that sprays a coolant directly onto the integrated circuit or integrated circuit packages. These systems typically require plumbing hardware to couple the nozzle to a cooling system which contains a compressor/pump and a heat exchanger.

It is sometimes desirable to replace the electronic cards of a system. Direct cooled electronic systems are typically constructed so that the plumbing hardware must be disassembled before the card can be detached from the system. Disassembly may require tools to detach fittings, seals, etc. It would be desirable to provide a direct cooled system that would allow an electronic card to be connected and detached from the system without having to use tools or assemble hardware. Additionally, it would also be desirable to detach an individual package or integrated circuit from the electronic card in a direct cooled system without the use of tools or hardware.

SUMMARY OF THE INVENTION

One embodiment of the present invention is an electronic system that may include an electronic card sub-module that is electrically connected to, and in fluid communication with, an electronic card module. The electronic card module can be mated with a motherboard and coupled to a manifold of a cooling system that provides a cooling fluid to the modules.

DETAILED DESCRIPTION

One embodiment of the present invention is an electronic system that may include an electronic card sub-module that is electrically connected to, and in fluid communication with, an electronic card module. The electronic card module can be mated with a motherboard and coupled to a manifold of a cooling system that provides a cooling fluid to the modules. The cooling fluid can flow directly onto integrated circuits or integrated circuit packages located within the modules. Each module may have an electrical connector and a fluid connector that allows the sub-module to be plugged into the module, and the module to be plugged into the motherboard and manifold without using any tools or hardware.

Figure 1:
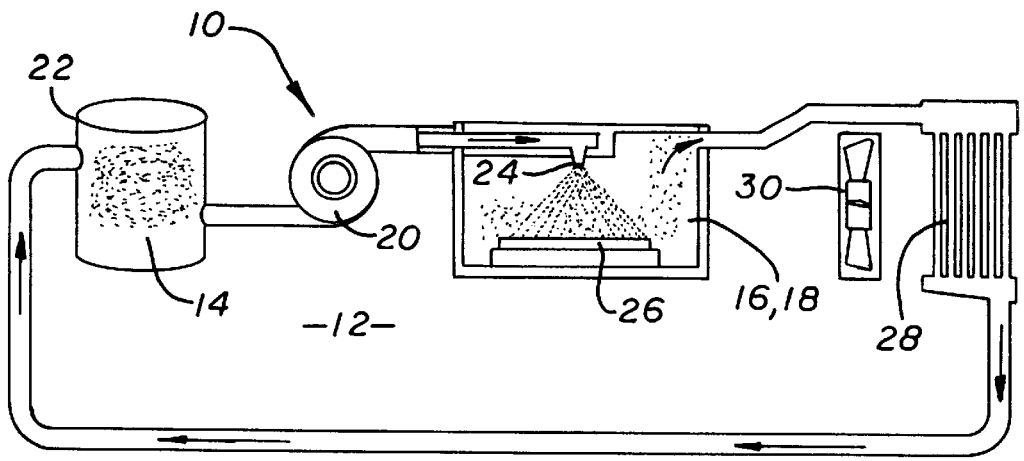
FIG. 1 is a schematic of an embodiment of an electronic system of the present invention.

Referring to the drawings more particularly by reference numbers, FIG. 1 shows an embodiment of an electronic system 10 of the present invention. The system 10 may include a cooling system 12 that provides a cooling fluid 14 to an electronic card module 16 and/or an electronic card sub-module 18.

The cooling system 12 may include a pump 20 that pumps fluid 14 from a reservoir 22 to the module/sub-module 16, 18. The module/sub-module 16, 18 may contain a nozzle 24 that atomizes the fluid 14. The atomized fluid 14 may be directed onto an integrated circuit 26. The integrated circuit 26 generates heat that is transferred into the fluid 14. The transfer of heat may cause the fluid to change into a gaseous phase.

The vaporized fluid 14 flows from the module/sub-module 16, 18 to a heat exchanger 28. The cooling system 12 may include a fan 30 that generates a flow of air across the heat exchanger 28 to remove heat from the fluid 14. The fluid 14 flows back into the reservoir 22 to complete the cycle.

Figure 2:
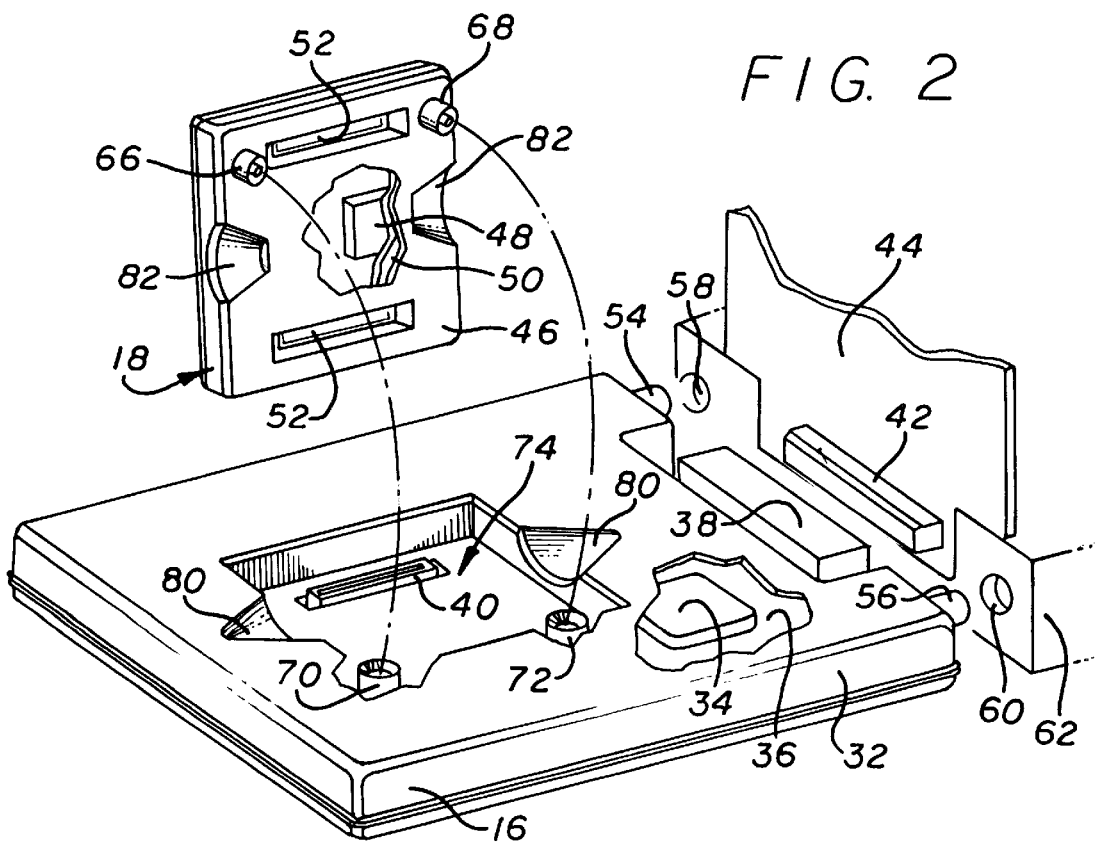
FIG. 2 is a top right perspective view of the electronic system.

FIG. 2 shows an embodiment of an electronic card module 16 and an electronic card sub-module 18. The module 16 may include a housing 32 that encloses one or more integrated circuit packages 34 that are mounted to a substrate 36. The integrated circuit packages 34 may each contain one or more integrated circuits (not shown). Although a package is shown and described, it is to be understood that the module 16 may contain integrated circuits that are directly mounted to the substrate 36.

The substrate 36 may a printed circuit board that is attached to a motherboard electrical connector 38 and a sub-module electrical connector(s) 40. The motherboard electrical connector 38 may be mated with a connector 42 that is mounted to a motherboard 44.

The sub-module 18 may also include a housing 46 that encloses one or more integrated circuit packages 48 that are mounted to a substrate 50. The integrated circuit packages 48 may each contain one or more integrated circuits (not shown). Although a package is shown an described, it is to be understood that the module 18 may contain integrated circuits that are directly mounted to the substrate 50.

The integrated circuit within the sub-module 18 may be a microprocessor that is coupled to the integrated circuit(s) of the module 16. Providing a detachable sub-module 18 allows an operator to easily install and replace the microprocessor of the system.

The substrate 50 of the sub-module may be a printed circuit board that is attached to electrical connectors 52. The electrical connectors 52 can be plugged into the electrical connectors 40 of the module 16. The electrical connectors 38, 40, 42 and 52, and the substrates 36 and 50 electrically connect the integrated circuit package 34 and 48 to each other and to the motherboard 44.

The module 16 may include an inlet fluid connector 54 and an outlet fluid connector 56 that can be plugged into corresponding fluid connectors 58 and 60 of a manifold 62. The manifold 62 may be coupled to the pump 20 and heat exchanger 28 of the cooling system 12 shown in FIG. 1.

Figure 3:
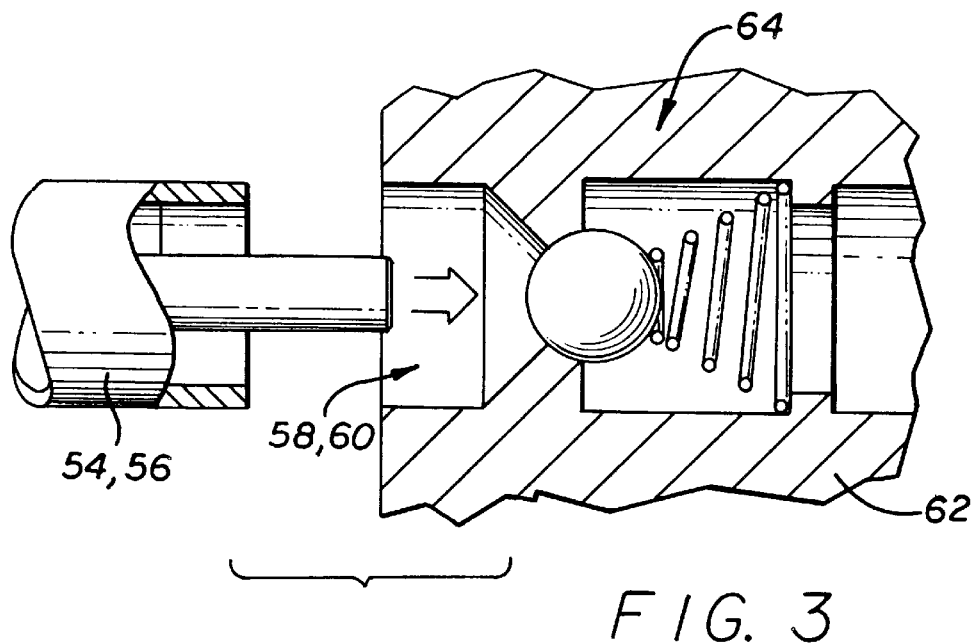
FIG. 3 is a cross-sectional view of a pair of fluid connectors of the electronic system.

As shown in FIG. 3, the fluid connectors 58 and 60 of the manifold 62 may each contain a spring biased normally closed valve 64. The valve 64 is opened when the corresponding fluid connector 54 or 56 of the module 16 is inserted into the fluid connector 58 or 60 of the manifold 62. Cooling fluid can flow from the manifold 62 into the module 16 when the valve 64 is open. When the module 16 is detached from the manifold 62 the valve 64 returns to the closed position so that fluid does not flow through the connector 58 or 60. The one-way valve 64 provides a means to allow the module 16 to be blindly mated with the manifold 62 and the motherboard 44.

Referring to FIG. 2, the sub-module 18 may include a pair of fluid connectors 66 and 68 that can be plugged into mating fluid connectors 70 and 72 of the module 16. The fluid connectors 70 and 72 may each have spring biased normally closed valves (not shown) that are opened when the sub-module 18 is plugged into the module 16. The valves allow fluid to flow into the sub-module 18 when in the open position and prevent fluid from flowing out of the module 16 in the closed position. The module 16 may have a pair of fluid lines (not shown) which couple the inlet 54 and outlet 56 connectors to the connectors 70 and 72, respectively, to a provide a direct fluid path between the manifold 62 and the sub-module 18. The electrical connector 34 and fluid connectors 70 and 72 may be located within an opening 74 that can receive the sub-module 18.

Figure 4:
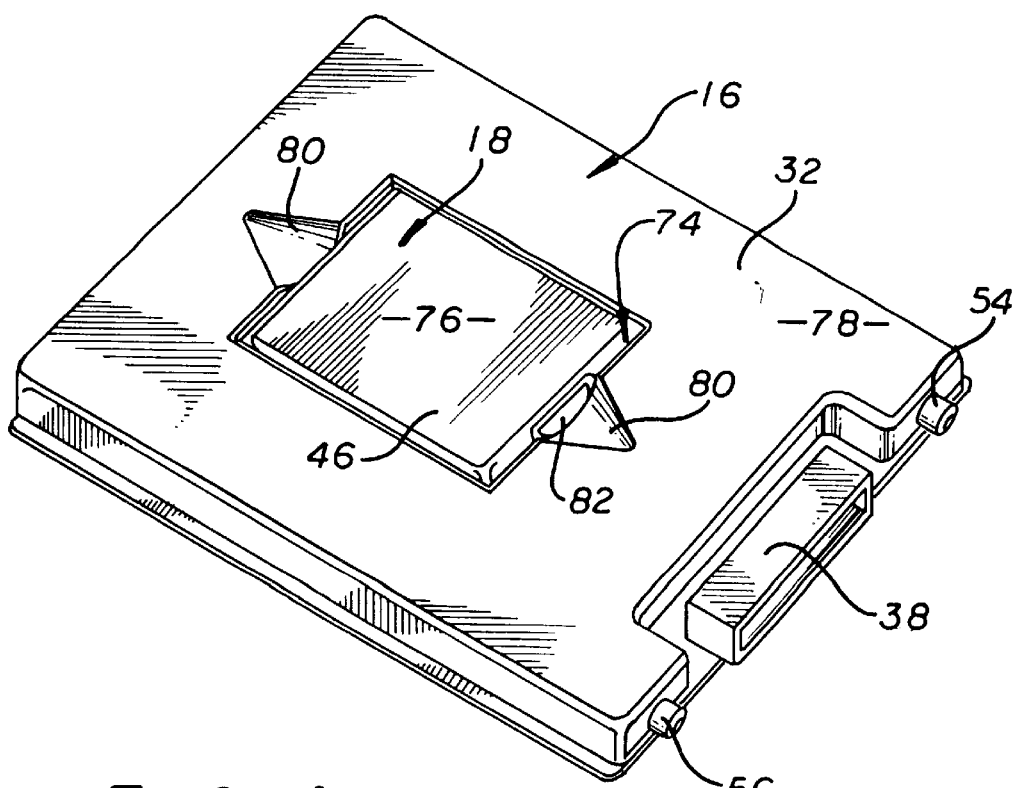
FIG. 4 is a top perspective view of an electronic card sub-module plugged into an electronic card module.

As shown in FIG. 4, the depth of the opening 74 may be such that when the sub-module 18 is plugged into the module 16, the sub-module top surface 76 is flush with the module top surface 78. The opening 74 thus minimizes the profile of the module/sub-module assembly.

The module housing 32 may have a pair of recesses 80 that allow an operator to insert a finger and more readily detach the sub-module 18 from the module 16. Likewise, the sub-module housing 46 may also have a pair of recesses 82 to assist in the removal of the sub-module 18 from the module 16.

The system can be assembled by plugging the sub-module 18 into the module 16 and then plugging the module 16 into the motherboard 44 and the manifold 62. Alternatively, the sub-module 18 can be plugged into the module 16, after the module 16 is plugged into the motherboard 44 and the manifold 62. The present invention provides an electronic system which allows both a module 16 and a sub-module 18 to be plugged into a direct cooled cooling system without using any tools or hardware.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:
   a manifold;
   a motherboard;
   an electronic card module that can be electrically connected to said motherboard, and coupled to said manifold to provide fluid communication with said manifold; and,
   an electronic card sub-module that can be electrically connected to said electronic card module and coupled to said electronic card module to provide fluid communication with said manifold.

2. The assembly of claim 1, wherein said electronic card sub-module includes an electrical connector that mates with an electrical connector of said electronic card module.

3. The assembly of claim 1, wherein said electronic card sub-module has a fluid connector that mates with a fluid connector of said electronic card module.

4. The assembly of claim 2, wherein said electronic card sub-module includes a housing that encloses an integrated circuit package that is mounted to a substrate, said substrate being attached to said electrical connector.

5. The assembly of claim 4, wherein said electronic card module includes a housing that encloses an integrated circuit package that is mounted to a substrate, said substrate being attached to said electrical connector.

6. The assembly of claim 5, wherein said electronic card module housing includes an opening that receives said electronic card sub-module.

7. The assembly of claim 5, wherein said electronic card module housing includes a recess.

8. The assembly of claim 4, wherein said electronic card sub-module housing includes a recess.

9. The assembly of claim 1, further comprising a cooling system that provides a cooling fluid to said electronic card module and said electronic card sub-module.

10. An electronic assembly, comprising:
    an electronic card module that includes a housing which encloses an integrated circuit package;
    an electronic card sub-module that includes a housing which encloses an integrated circuit package, said electronic card sub-module being in fluid communication with said electronic module;
    a heat exchanger that is in fluid communication with said electronic card module; and,
    a pump that pumps a cooling fluid through said electronic card module, said electronic card sub-module and said heat exchanger.

11. The assembly of claim 10, wherein said electronic card sub-module includes an electrical connector that mates with an electrical connector of said electronic card module.

12. The assembly of claim 10, wherein said electronic card sub-module has a fluid connector that mates with a fluid connector of said electronic card module.

13. The assembly of claim 10, wherein said electronic card module housing includes an opening that receives said electronic card sub-module.

14. The assembly of claim 10, wherein said electronic card module housing includes a recess.

15. The assembly of claim 10, wherein said electronic card sub-module housing includes a recess.

16. A method for assembling an electronic assembly, comprising the steps of:
    plugging an electronic card sub-module into an electronic card module; and,
    plugging the electronic card module into a motherboard and a manifold.

17. The method of claim 16, further comprising the step of pumping a cooling fluid through the electronic card module and the electronic card sub-module.

* * * * *